United States Patent [19]

Kleeberg et al.

[11] 4,072,524

[45] Feb. 7, 1978

[54] MIXTURES YIELDING THERMALLY STABLE PHOTO-CROSSLINKABLE LAYERS AND FOILS

[75] Inventors: Wolfgang Kleeberg, Erlangen; Roland Rubner, Rottenbach u Forchheim; Wieland Bartel, Furth, all of Germany

[73] Assignee: Siemens Aktiengesellschaft, Munich, Germany

[21] Appl. No.: 637,189

[22] Filed: Dec. 3, 1975

[30] Foreign Application Priority Data

Dec. 6, 1974  Germany ............................. 2457882

[51] Int. Cl.$^2$ ................................................. G03C 5/00
[52] U.S. Cl. ................................... 96/35.1; 96/115 R; 204/159.14; 204/159.15
[58] Field of Search ................ 96/35.1, 115 R, 115 P; 204/159.14, 159.15, 159.16

[56] References Cited

U.S. PATENT DOCUMENTS

| | | | |
|---|---|---|---|
| 3,060,022 | 10/1962 | Duerr | 96/115 P X |
| 3,147,119 | 9/1964 | Evans et al. | 96/115 P |
| 3,462,267 | 8/1969 | Giangualano et al. | 96/35.1 X |
| 3,469,983 | 9/1969 | Diener et al. | 96/115 P X |
| 3,619,187 | 11/1971 | Cerwonka | 96/115 P X |
| 3,832,187 | 8/1974 | Kleeberg et al. | 96/115 R |
| 3,905,820 | 9/1975 | Frass | 96/115 P X |
| 3,932,401 | 1/1976 | Berg et al. | 96/115 P X |
| 3,957,512 | 5/1976 | Kleeberg et al. | 96/35.1 |

*Primary Examiner*—Edward C. Kimlin
*Attorney, Agent, or Firm*—Kenyon & Kenyon, Reilly, Carr & Chapin

[57] ABSTRACT

The invention provides mixtures based on resins containing allyl groups and being solid at room temperature, useful for the preparation of thermally stable, photo-crosslinkable layers and foils. According to the invention, such mixtures comprise triallylcyanurate prepolymers and/or triallylcyanurate precopolymers with compounds containing allyloxy and/or allylester groups, and compounds with at least one N-maleimide group, wherein the C≡C double bond of the N-maleimide groups are bonded to hydrogen, hydrogen and chlorine or hydrogen and methyl radicals. Preferably, the N-maleimide C≡C bonds carry hydrogen.

19 Claims, No Drawings

MIXTURES YIELDING THERMALLY STABLE PHOTO-CROSSLINKABLE LAYERS AND FOILS

BACKGROUND OF THE INVENTION

This invention is concerned with mixtures yielding thermally stable, photo-crosslinkable layers and foils based on resins which contain allyl groups and are solid at room temperature, useful for the photographic preparation of layered structures.

Light-sensitive compositions based on inert organic polymeric binding agents, thickening agents or matrices and acrylic or methacrylic compounds are known in the art from German Auslegeschriften Nos. 1,205,386, 1,200,130, and 1,915,571 and form German Offenlegungsschriften Nos. 1,906,668 and 2,149,056. These compositions are partly usable in foil form for the generation of patterns and structures. The layered structures that can be produced from these compositions have only limited thermal stability. In addition, relatively high concentrations of the photo-reactive acrylic or methacrylic compounds are necessary for producing high light sensitivity. This leads to sticky photosensitive layers which, when used in common photographic techniques with contact copies, must be exposed through protective films. Since the pattern and the photosensitive layer are not in direct contact with each other, inferior resolution results due to light diffraction.

Furthermore, thermally stable, photo-crosslinkable materials having a resin component containing allyl groups are known according to U.S. Pat. No. 3,462,267 and South-African Patent No. 05209. The materials described therein however have the common disadvantage that layers having a thickness of no greater than about 1 to 5 μm have sufficient light sensitivity, but with increasing layer thicknesses the light sensitivity diminishes. It is further known from German Patent No. 2,130,904 that certain photo-cross linkable systems exhibit cross-linking speeds with layer thicknesses of more than 10 μm and these make possible the preparation of layered structures with sharp contours and good insulating properties. These systems consist of a prepolymer component containing carboxylic acid allylester groups and compounds containing maleimide groups. A limiting effect for many applications of such systems is the limited thermal stability of the described prepolymer components.

It has now been found according to the present invention that surprisingly the ring-positioned allyloxy groups of triallylcyanurate prepolymers in combination with compounds containing N-maleimide groups, if exposed to actinic light, give high crosslinking speeds at layer thicknesses of more than 10 μm. The light-sensitive mixtures according to this invention, yield layers and films for the photographic preparation of thermally stable layered and film structures having sharp contours and of crosslinked coatings with good insulating properties.

SUMMARY OF THE INVENTION

According to the present invention, the mixtures comprise triallylcyanurate prepolymers and/or triallylcyanurate precopolymers with compounds containing allyloxy and/or allylester groups and compounds containing at least one N-maleimide group whose maleimide C=C bond carries hydrogen, hydrogen and chlorine or hydrogen and methyl radicals, but preferably, hydrogen.

The photo-crosslinked coatings from these compositions obtained through the action of actinic light or the exposed photographic copies which can be produced with sharp contours by solvent etching, are distinguished particularly by their high thermal stability, in addition to their insulating properites, i.e., high aging stability, high electric surface and bulk resistance, low water absorption and swelling. Thermogravimetric analysis shows that the materials still have excellent stability at 300° C; with a heating rate of 5° C/min in air, a weight loss of 0.5%/min occurs at 300° C and the color of the material remains unchanged. The weight loss of relatively heat-stable systems in accordance with German Patent No. 2,130,904 using polydiallylorthophthalate as the resin component containing carboxylic acid allylester groups, is higher by a factor of 6 at 300° C, and at the same time, the material is discolored black. To the extent that handling requires, the materials according to the present invention are solder-bath proof and mechanically stable, and also exhibit at least a 140° C fatigue strength in air.

DETAILED DESCRIPTION OF THE PREFERRED EMBODIMENTS

As components of the mixtures according to the invention containing allyloxy groups, film-forming triallylcyanurate prepolymers and precopolymers of triallylcyanurate with compounds containing allyloxy- and/or allylester groups are suitable such as, phenylallylether, bisphenol-A-bisallylether, benzoic acid allylester, diallylphthalate, diallylisophthalate or diallylterephthalate, which can be prepared by methods known in the art from triallylcyanurate and other comonomers by polymerization up to a period shortly before gelation and by subsequent separation into soluble polymer or copolymer fractions and a monomer fraction, for instance, according to U.S. Pat. No. 3,030,341.

Suitable components of the mixtures according to the invention containing N-maleimide groups are aliphatically, aromatically or heterocyclically nitrogen-substituted maleimides, 3-chloromaleimides, 3-methylmaleimides such as, N-cyclohexylmaleimide, N-phenylmaleimide, N-phenylmaleimide substituted at the benzene nucleus (Preferred substituents have alkyl groups in the o-position) as well as compounds having two or more N-maleimide groupings, as are obtained from the corresponding polyfunctional amines, such as, for instance, hexamethylene diamine, m-phenylene diamine, p,p'-diaminodiphenyl or p,p'-diaminodiphenylmethane in a known manner by reaction of these compounds with maleic acid anyhdride. Preferably, N-arylmaleimides are used. N-aryl-maleimides, alkyl-substituted in the ortho-position, such as, for instance, N-o-tolylmaleimide, have been found particularly suitable.

The properties of the mixtures according to the invention can further be modified, in the kind and content of comonomer components of the triallylcyanurate prepolymers, by components of polymers compatible with polytriallylcyanurate. Thus, the addition of polyester resins brings about increased flexibility. Particularly suited are portions of unsaturated polyester resins, i.e., polymers containing maleate and/or fumarate structure elements. Surprisingly, it has been found that these unsaturated polyester resins degrade the original light sensitivity of the mixture of triallylcyanurate prepolymers with compounds containing N-maleimide groups only inappreciably or not at all. Accordingly, the conclusion may be drawn that the maleate or fumarate double bonds of the unsaturated polyester resins copolymerize upon exposure to light with the photoreactive allyloxy- and/or maleimide groups and thus participate in the cross-linking reaction and in the process also change the solubility of the polyester resins. Thus, excellent edge sharpness and high resolution can be achieved also in the presence of the unsaturated polyester resins. The content of unsaturated polyester resins may be up to 50% by weight; preferably, 5 to 30%. The ratio of the allyl double bond equivalents, and as the case may be, including the maleate and/or fumarate double bond equivalents of unsaturated polyester components, to the N-maleimide double bond equivalents is equal to or greater than 1, and preferably 2 to 150. Preferably used are unsaturated polyester resins with an acid number smaller than 25 and preferably smaller than 10. The polyester resins are prepared by known polyaddition or polycondensation methods (see, for instance, the book by J. Bjoerksten et al., Polyesters and their Application, Reinhold Publishing Corporation, New York, 1956). Many unsaturated polyester resins useful in the present invention are available as commercial products.

The cross-linking speed can be increased further by the addition of suitable photosensitizers and/or initiators, preferably in percentages of less than 2% by weight.

Highly suited as sensitizers and/or initiators are, for instance, Michler's ketone and/or benzoinether, 2-tert-butyl-9, 10-anthraquinone, 1, 2-benz-9, 10-anthraquinone, 4, 4'-bis-diethylamino)-benzophenone.

The mixtures according to the invention can be dissolved in inert organic solvents, applied to a substrate, e.g., a film, and cross-linked by exposure to actinic light after the solvent has evaporated. By pattern-wise exposure through a copying pattern and subsequent solvent treatment, copies with sharp contours are obtained.

The mixtures according to the invention can further be adjusted by components of up to 20% by weight of low-molecular to oligomeric, preferably liquid to viscous, olefinically-unsaturated compounds, preferably methacrylic, acrylic, vinyl, allyl, maleic acid or fumaric acid compounds, so that they can still be calendered and extruded at temperatures below 100° C down to room temperature and can therefore be processed in a technically advantageous manner into self-supporting polymer films or photopolymer films embedded between protective films. Suitable compounds are, for example, ethylene glycolbismethacrylate or -acrylate, diethyleneglycolbismethacrylate or -acrylate, trimethylolpropane trimethacrylate or -acrylate, glycerin trismethacrylate or -acrylate, 1,3-propanediolbismethacrylate or -acrylate, 1,2,4-butane trioltrimethacrylate or -acrylate, hydroquinone bismethacrylate or -acrylate, pentaerythritol tetramethacrylate or -acrylate, polyethyleneglycol bismethacrylate or -acrylate having molecular weights of 200 to 500, divinylsuccinate, divinylphthalate, allylbenzoate, diallylphthalate, maleic acid or fumaric acid diethylester. Methacrylic compounds are preferred.

Preferably, contents of between 5 and 10% by weight are used. The photopolymer films or foils obtainable in this manner are flexible, non sticky and can be exposed for generating patterns or structures through protective foils as well as, for direct contact with the pattern which is preferable. Subsequent solvent treatment then yields patterns and structures with particularly sharp contours. The additions do not adversely effect the light sensitivity of the photopolymers and the thermal stability of the photo-crosslinked layered structures.

The ready-to-use solutions of the photo-crosslinkable mixtures according to the invention and the ready-to-use films and foils prepared from the mixtures according to the invention have a high storage stability of more than ½ year at room temperature, if protected from light.

The mixtures according to the invention can be cross-linked by exposure to actinic light of any origin and kind as well known in the art.

The mixtures according to the invention contain components which are readily available and can be produced inexpensively and can be transformed by simple means into heat-resistant insulating layers, insulating layer structures and images. The adhesion of the layers, layer structures and images produced on different substrates can be further improved by commonly used adhesive agents such as, the organo-silicon compounds, i.e., vinyltriethoxysilane, vinyltrimethoxysilane, γ-methacryloxy-propyltrimethoxysilane and particularly, by 2,4-diallyloxy-6-[3-(triethoxysilyl)propyl] aminotriazine. They can be provided in a known manner with seed layers for generating highly adhering electro-deposits. The conditions for a wide and technically advantageous application of the photocrosslinked insulating materials therefore exist. The mixtures according to the invention are generally suited for the applications described in the German Patent No. 2,130,904 and in addition, particularly for the preparation of thermally stable patterns and insulating, passivating and other protective layers and layered structures, especially as in aid in the manufacture or as part of components and circuits in electrotechnology, such as, solder protection layered structures on circuit boards for passivation structures on semiconductor components or easily removable photoresists for evaporation, sputtering, implantation and diffusion, ion-etching and other etching processes and for electroplating processes in the manufacture of semiconductor components.

The invention will be explained in further detail in the following examples:

EXAMPLE 1

Preparation of a triallylcyanurate prepolymer.

Exactly 800 parts by weight triallylcyanurate were dissolved in 800 parts by volume xylene and reacted at 90° C with 40 parts by weight of a 50-% benzoylperoxide paste, while stirring.

After the exothermic reaction had died down, stirring was continued at 130° C until the reaction solution had a viscosity of about 65 [$10^3 Ns/m^2$]. From the cold reaction solution, the prepolymer was precipitated by dropping-in 6000 parts by volume isopropanol and drying under a vacuum at 50° C. The yield was 45%. The product had 0.64 double-bond equivalents per 100 g and will be designated in the following as PTAC.

Exactly 50 parts by weight PTAC, 3.75 parts by weight N-cyclohexylmaleimide and 0.5 parts by weight Michler's ketone were dissolved in 200 parts by volume trichloroethylene. The solution was filtered and centrifuged on glass substrates to form uniform films, which were 15 μm thick after the solvent had evaporated.

The films were exposed through a contact pattern for 20 sec to a 500-W (Very-high-pressure) mercury lamp placed at a distance of 23 cm from the films. Subsequently, well-adhering structures with sharp edges and high resolution (better than 20 μm) were produced by immersion in 1,1,1-trichloroethane for 2 minutes and a mixture of 1,1,1-trichloroethane and trichloroethylene (2:1) for 5 sec and washing with isopropanol. The film structures withstood the usual solder bath temperature of 260° C for 30 sec without damage. The electric bulk resistance of the crosslinked, hardened films, measured in accordance with DIN 53482, was higher than $10^{14}$ ohm-cm, and the dielectric constant, measured in accordance with DIN 53483, was about 3 at $10^3$ Hz.

EXAMPLE 2

Exactly 50 parts by weight PTAC, 3.75 parts by weight N-phenyl maleimide and 0.5 parts by weight Michler's ketone were dissolved in 200 parts by volume trichloroethylene and, as described in Example 1, centrifuged on aluminum foil to form films 15 μm thick, exposed for 20 sec and developed to form structures with sharp contours, great adhesitivity and resolution (better than 20 μm). The film structures withstood the usual solder bath temperature of 260° C for 30 sec without damage. The electric bulk resistance of the crosslinked hardened films was higher than $10^{14}$ ohm-cm as measured in accordance with DIN 53482 and the dielectric constant was about 3 at $10^3$ Hz, as measured in accordance with DIN 53483.

EXAMPLE 3

Exactly 50 parts by weight PTAC, 3.75 parts by weight N-phenylmaleimide, 0.5 parts by weight Michler's ketone and 5 parts by weight 2,4-diallyloxy-6-[3(triethoxysilyl)propyl] aminotriazine were dissolved in 1000 parts by volume of trichloroethylene and processed by centrifuging on silicon wafers with an oxide surface to form films 1 μm thick. By centrifuging a solution of 50 parts by weight PTAC, 3.75 parts by weight N-phenyl maleimide, and 0.5 parts by weight Michler's ketone in 200 parts by volume trichloroethylene, films 15 μm thick were then applied to the thin films. By exposing and developing as in Example 1, similar structures with sharp edges were produced, which had particularly good adhesion.

EXAMPLE 4

Exactly 50 parts by weight PTAC, 3.75 parts by weight o-tolylmaleimide, 0.5 parts by weight Michler's ketone and 0.5 parts by weight benzoinisopropyl ether were dissolved in 200 parts by volume toluene and centrifuged on $Al_2O_3$ ceramic substrates to form films 15 μm thick. As described in Example 1, the films were exposed for 10 sec through a contact-copy pattern and developed. The highly adhering layer structures with sharp contours withstood the usual solder bath temperature of 260° C for 1 min without damage. The electric bulk resistance of the crosslinked, hardened films was above $10^{14}$ ohm-cm, measured in accordance with DIN 53482, and the dielectric constant, as measured in accordance with DIN 53483, was about 3 at $10^3$ Hz.

EXAMPLE 5

Exactly 50 parts by weight PTAC, 3.75 parts by weight o-tolylmaleimide, 0.5 parts by weight Michler's ketone, 0.5 parts by weight benzoinisopropyl ether and 0.5 parts by weight 2,4-diallyloxy-6-[3(triethoxysylil)-propyl] aminotriazine were dissolved in 200 parts by volume toluene and centrifuged on $Al_2O_3$ ceramic substrates to form films 15 μm thick. By exposing and developing as in Example 4, corresponding layered structures with sharp contours were produced which exhibited particularly good adhesion.

EXAMPLE 6

Exactly 40 parts by weight PTAC, 10 parts by weight of a polyester resin with the acid number 20, containing the components fumaric acid, isophthalic acid and neopentylglycol in the mole ratio of 2:3:5, 3.75 parts by weight o-tolylmaleimide, 0.5 parts by weight Michler's ketone and 0.5 parts by weight benzoinisopropyl ether were dissolved in 200 parts by volume xylene, centrifuged on a 50-μm Cu foil to form films 15 μm thick and converted, as described in Example 1, into layered structures with sharp contours by exposing and developing. The elasticity and adhesion of the scratch-proof layers were demonstrated from the bending mandrel test according to DIN 53152. With a bending mandrel diameter of 2 mm, neither cracks nor flaking-off appeared, and likewise by crinkling the coated foil. The electric bulk resistance of the crosslinked films, measured in accordance with DIN 53482, was higher than $10^{14}$ ohm-cm and the dielectric constant, as measured in accordance with DIN 53483, was about 3 at $10^3$ Hz.

Epoxy resin circuit boards with a final copper and tin surface were sprayed by means of a spray gun with the solution above and in this manner coated with films 30 μm thick. After exposing 30 sec through a contact copy in a Gyrex printer 900, developing and washing as in Example 1 and drying of the boards at 120° C for 30 min, perfectly soldered circuit boards with the solder resist layers intact were obtained in a wave soldering operation at 260° C. Similar results were obtained when the solution above contained additionally as a pigmentation component, 0.1 parts by weight Viktoria blue BOD Type 1246 (neutral) of the firm BASF.

EXAMPLE 7

Exactly 80 parts by weight of PTAC, 20 parts by weight of a polyester resin with the acid number 20, containing fumaric acid, isophthalic acid and neopentylglycol in the mole ratio 2:3:5, 7.5 parts by weight o-tolylmaleimide, 0.5 parts by weight Michler's ketone, 0.5 parts by weight benzoiniospropyl ether and 10 parts by weight diethyleneglycolbismethacrylate were mixed in a calender at room temperature and then calendered at 90° C to form sandwich foils with a polyethylene carrier and polyethylene terephthalate cover foils of 20 μm and a photoreactive intermediate layer of 60 μm.

After the carrier foil was pulled off, the sandwich foils were led over a cylinder with a temperature of 90° C and laminated onto epoxy resin circuit boards with a final copper or tin surface.

Part of the circuit boards was exposed in the Gyrex printer 900 through negative copy, which was in close contact with the cover foil, for 40 sec and developed as described in Example 1.

In another part of the coated circuit plates, the polyethyleneterephthalate cover foil was pulled off and the exposure was carried out with close contact between the negative copy and the photoreactive layer. In the latter case, structures with considerably sharper contours resulted. The solder resist layers withstood the subsequent wave solder operation at 260° C without change. The electric bulk resistance of these layers, measured in accordance with DIN 53482, was above $10^{14}$ ohm-cm and the dielectric constant, as measured in accordance with DIN 53483, was about 3 at $10^3$ Hz.

What is claimed is:

1. A composition comprising a mixture of;
   a. a triallyl cyanurate prepolymer and/or a precopolymer of triallyl cyanurate with a compound containing a radical selected from the group consisting of allyloxy, allylester and mixtures thereof; and
   b. a compound containing at least one N-maleimide group wherein the C=C double bond of the N-maleimide group is bonded to two radicals selected from the group consisting of hydrogens, hydrogen and chlorine, and hydrogen and methyl.

2. The composition of claim 1 wherein the C=C double bond of said N-maleimide group are bonded to two hydrogens.

3. The composition of claim 1 wherein the N-maleimide group is an N-aryl maleimide.

4. The composition of claim 3 wherein the aryl group of said N-aryl maleimide is substituted by an alkyl group in the ortho position.

5. The composition of claim 4 wherein said N-aryl maleimide is N-o-tolylmaleimide.

6. The composition of claim 1 which further comprises soluble olefinically unsaturated polymers.

7. The composition of claim 1 wherein the ratio of allyl double bond equivalents to maleimide double bond equivalents is at least 1.

8. The composition of claim 7 wherein the ratio is from about 2 to 150.

9. The composition of claim 6 wherein the ratio of allyl double bond equivalents and soluble olefinically unsaturated polymer double bond equivalents to maleimide double bond equivalents is at least 1.

10. The composition of claim 9 wherein the ratio is from about 2 to 150.

11. The composition of claim 6 wherein the soluble unsaturated polymers are unsaturated polyester resins.

12. The composition of claim 11 wherein the unsaturated polyester resins contain elements selected from the group consisting of maleate, fumarate and mixtures thereof.

13. The composition of claim 11 wherein the acid number of the unsaturated polyester resin is less than 25.

14. The composition of claim 1 which further comprises a photo initiator or photosensitizer in an amount by weight no greater than 2% based on the weight of all components of the mixture.

15. The composition of claim 1 which further comprises up to 20% by weight based on all components of the mixture of a copolymerizable olefinically unsaturated compound, said compound being of low molecular weight to oligomeric and having a consistency of liquid to viscous.

16. The composition of claim 15 wherein said olefinically unsaturated compounds comprise from 5% to 10% by weight based on all components of said mixtures.

17. The composition of claim 15 wherein the olefinically unsaturated compounds are methacrylic compounds.

18. A process for the photographic preparation of patterns and for the preparation of protective layers and layered structures comprising:
   a. forming a film or foil of the composition of claim 1 on a substrate;
   b. pattern wise exposing said film or foil to actinic radiation; and
   c. developing said film or foil.

19. The process of claim 18 wherein the exposing takes place in direct contact with the copying pattern.

* * * * *